(12) United States Patent
Akazawa et al.

(10) Patent No.: US 10,525,564 B2
(45) Date of Patent: Jan. 7, 2020

(54) REVERSING MACHINE AND SUBSTRATE POLISHING APPARATUS

(71) Applicant: Ebara Corporation, Tokyo (JP)

(72) Inventors: Kenichi Akazawa, Tokyo (JP); Kenichi Kobayashi, Tokyo (JP); Akihiro Yazawa, Tokyo (JP); Manao Hoshina, Tokyo (JP)

(73) Assignee: Ebara Corporation, Tokyo (JP)

( * ) Notice: Subject to any disclaimer, the term of this patent is extended or adjusted under 35 U.S.C. 154(b) by 180 days.

(21) Appl. No.: 15/248,028

(22) Filed: Aug. 26, 2016

(65) Prior Publication Data

US 2017/0072531 A1    Mar. 16, 2017

(30) Foreign Application Priority Data

Sep. 14, 2015    (JP) .................................. 2015-180502

(51) Int. Cl.
| | |
|---|---|
| B24B 41/00 | (2006.01) |
| B24B 27/00 | (2006.01) |
| B08B 3/02 | (2006.01) |
| B24B 9/00 | (2006.01) |

(52) U.S. Cl.
CPC .............. *B24B 41/005* (2013.01); *B08B 3/02* (2013.01); *B24B 9/00* (2013.01); *B24B 27/0069* (2013.01)

(58) Field of Classification Search
CPC ... B24B 37/345; B24B 37/042; B24B 37/013; B24B 27/0069; B24B 41/005; B24B 55/03; H01L 21/67086; H01L 21/68707; B08B 3/02

USPC ............................................. 451/287, 10, 11
See application file for complete search history.

(56) References Cited

U.S. PATENT DOCUMENTS

| | | | | |
|---|---|---|---|---|
| 6,409,576 | B1* | 6/2002 | Oguri ................... | B24B 37/013 451/10 |
| 2002/0157692 | A1* | 10/2002 | Ishihara .................. | B08B 1/04 134/134 |
| 2006/0045722 | A1* | 3/2006 | Hashimoto ....... | H01L 21/68707 414/754 |
| 2008/0199284 | A1* | 8/2008 | Mitsuyoshi ....... | H01L 21/67051 414/223.02 |
| 2009/0067959 | A1* | 3/2009 | Takahashi ............. | B24B 37/345 414/226.01 |
| 2009/0270015 | A1* | 10/2009 | D'Ambra ............ | B24B 27/0076 451/28 |
| 2014/0220866 | A1 | 8/2014 | Ishii et al. | |

* cited by examiner

*Primary Examiner* — Timothy V Eley
(74) *Attorney, Agent, or Firm* — Abelman, Frayne & Schwab

(57) ABSTRACT

Disclosed is a reversing machine that reverses a substrate upside down. The reversing machine includes: a first arm pair configured to mount a substrate thereon; a second arm pair facing the first arm pair; an opening/closing mechanism configured to open/close the second arm pair so as to grip the substrate mounted on the first arm pair; and a rotating mechanism configured to rotate the first arm pair and the second arm pair around a predetermined axis that is set inside the first arm pair and the second arm pair and extends along an extension direction of the first arm pair and the second arm pair such that the substrate is reversed upside down.

15 Claims, 14 Drawing Sheets

REVERSING MACHINE AND SUBSTRATE POLISHING APPARATUS

CROSS-REFERENCE TO RELATED APPLICATIONS

This application is based on and claims priority from Japanese Patent Application No. 2015-180502, filed on Sep. 14, 2015, with the Japan Patent Office, the disclosure of which is incorporated herein in its entirety by reference.

TECHNICAL FIELD

The present disclosure relates to a reversing machine that reverses a substrate upside down, and a substrate polishing apparatus that includes such a reversing machine.

BACKGROUND

Many of conventional bevel polishing apparatuses polish only the peripheral edge of a substrate using a polishing tape in order to remove foreign matter sticking to a bevel portion of the substrate, and do not polish the rear surface of the substrate. In such bevel polishing apparatuses, only the front surface of a substrate may be cleaned and the rear surface of the substrate may not be cleaned.

In contrast, a recently developed bevel polishing apparatus polishes the rear surface of a substrate as well as the bevel portion of the substrate (see, e.g., Japanese Patent Laid-Open Publication No. 2014-150178). In such a bevel polishing apparatus, it is necessary to reverse the substrate upside down in order to clean the rear surface of the substrate.

SUMMARY

According to an aspect of the present disclosure, there is provided a reversing machine that reverses a substrate upside down. The reversing machine includes: a first arm pair configured to mount a substrate thereon; a second arm pair facing the first arm pair; an opening/closing mechanism configured to open/close the second arm pair so as to grip the substrate mounted on the first arm pair; and a rotating mechanism configured to rotate the first arm pair and the second arm pair around a predetermined axis that is set inside the first arm pair and the second arm pair and extends along an extension direction of the first arm pair and the second arm pair such that the substrate is reversed upside down.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
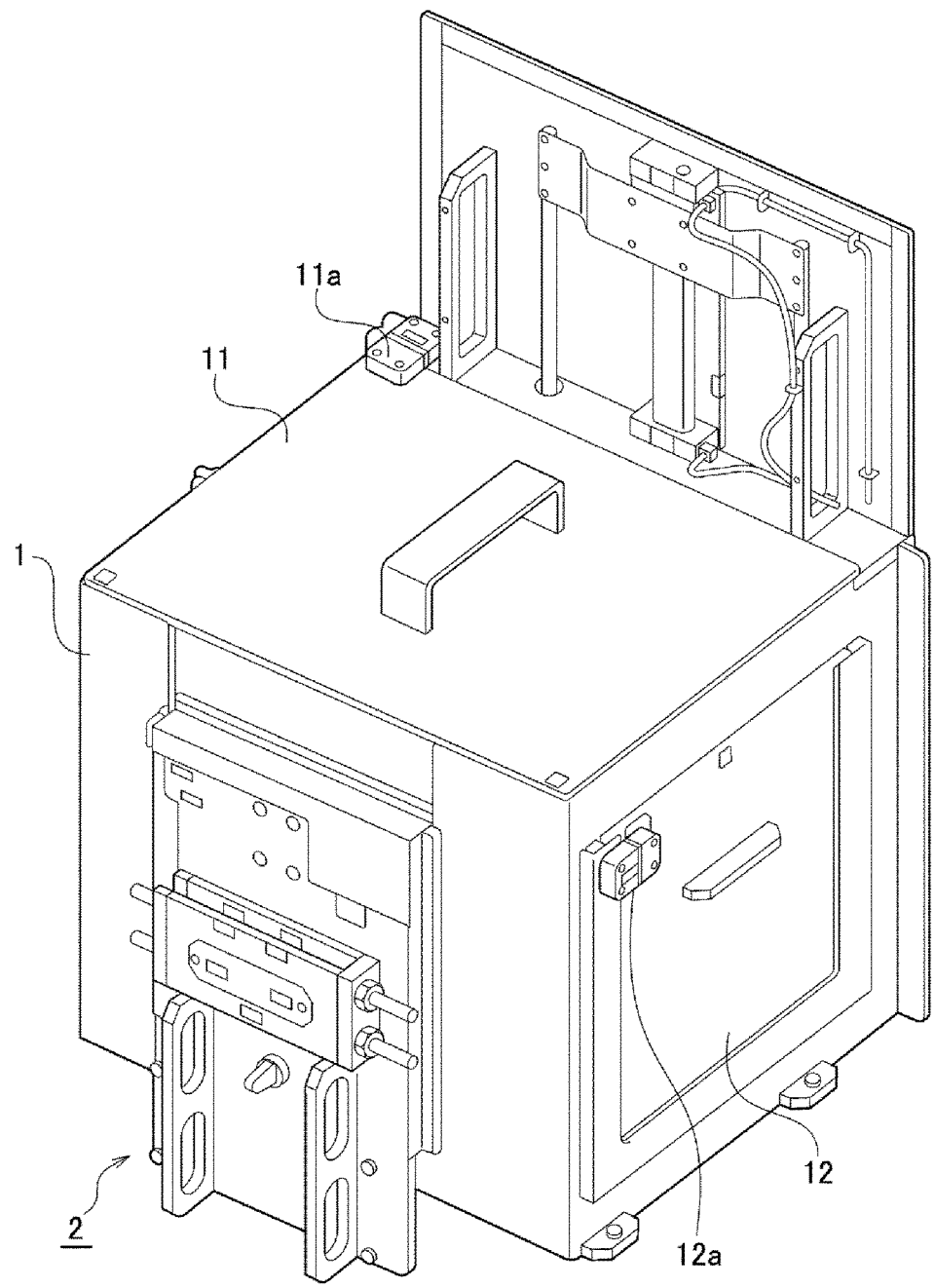
FIG. 1 is a perspective view of a reversing machine according to an exemplary embodiment.

In the following detailed description, reference is made to the accompanying drawings, which form a part hereof. The exemplary embodiments described in the detailed description, drawings, and claims are not meant to be limiting. Other exemplary embodiments may be utilized, and other changes may be made, without departing from the spirit or scope of the subject matter presented here.

When a reversing machine configured to reverse a substrate upside down is provided with a temporary mounting table configured to deliver the substrate, which has been reversed upside down, to a substrate transferring apparatus or a lifting mechanism configured to mount the substrate on the temporary mounting table, there is a problem in that the reversing machine becomes enlarged.

The present disclosure has been made in consideration of this problem, and is to provide a compact reversing machine that reverses a substrate upside down and a substrate polishing apparatus that includes such a reversing machine.

According to an aspect of the present disclosure, there is provided a reversing machine that reverses a substrate upside down. The reversing machine includes: a first arm pair configured to mount a substrate thereon; a second arm pair facing the first arm pair; and an opening/closing mechanism configured to open/close the second arm pair to grip the substrate mounted on the first arm pair; and a rotating mechanism configured to rotate the first arm pair and the second arm pair around a predetermined axis that is set inside the first arm pair and the second arm pair and extends along an extension direction of the first arm pair and the second arm pair such that the substrate is reversed upside down.

According to this configuration, the delivery and reversing of a substrate are enabled by using an arm pair positioned at the upper side and an arm pair positioned at the lower side. That is, when the reversing machine receives a substrate, the arm pair positioned at the upper side is opened while maintaining the arm pair positioned at the lower side in the closed state so that the substrate is mounted on the arm pair positioned at the lower side. Thereafter, the arm pair positioned at the upper side is closed so as to grip the substrate. While maintaining the state where the substrate is mounted on the arm pair positioned at the lower side, the two sets of arm pairs are rotated around a single axis so at to reverse the substrate upside down. Subsequently, the arm pair positioned at the upper side is opened while maintaining the arm pair positioned at the lower side in the closed state. Consequently, since it is possible to perform a series of operations that enables the substrate mounted on the arm pair positioned at the lower side to be delivered to the next process, a temporary mounting table is not needed and the reversing machine may be miniaturized.

The predetermined axis may be a symmetric axis of the first arm pair and the second arm pair. According to this configuration, since the positions of the substrate are coincident with each other before and after the substrate is reversed upside down, the reversing machine may be further miniaturized.

According to another aspect of the present disclosure, there is provided a reversing machine that reverses a substrate upside down. The reversing machine includes: a first arm pair configured to mount a substrate thereon; a second arm pair facing the first arm pair, and configured to be opened/closed so as to grip the substrate mounted on the first arm pair; and a rotating mechanism configured to rotate the first arm pair and the second arm pair so as to reverse the substrate upside down such that, before and after the substrate is reversed upside down, the positions of the substrate are substantially coincident with each other.

According to this configuration, the delivery and reversing of a substrate are enabled by using the arm pair positioned at the upper side and the arm pair positioned at the lower side. That is, when the reversing machine receives a substrate, the arm pair positioned at the upper side is opened while maintaining the arm pair positioned at the lower side in the closed state so that the substrate is mounted on the arm pair positioned at the lower side. Thereafter, the arm pair positioned at the upper side is closed so as to grip the substrate. While maintaining the state where the substrate is mounted on the arm pair positioned at the lower side, the two sets of arm pairs are rotated so as to reverse the substrate upside down such that the positions of the substrate are coincident with each other before and after the substrate is reversed upside down. Subsequently, the arm pair positioned at the upper side is opened while maintaining the arm pair positioned at the lower side in the closed state. Consequently, it becomes possible to perform a series of operations that enable the substrate mounted on the arm pair positioned at the lower side to be delivered to a next process. Therefore, a temporary mounting table is not needed, and the reversing machine may be miniaturized.

The reversing machine may be configured such that the positional relationship between the arm members of the first arm pair and the second arm pair is changed when the rotating mechanism rotates the first arm pair and the second arm pair. According to this configuration, the structure of the reversing machine may be simplified.

The reversing machine may further include a first rinse nozzle configured to supply rinse ice to the top surface of the gripped substrate and a second rinse nozzle configured to supply rinse water to the bottom surface of the gripped substrate. According to this configuration, it is possible to prevent the substrate from being dried when the substrate is reversed upside down.

The reversing machine may further include a cleaning tank configured to accommodate the first arm pair, the second arm pair, the first rinse nozzle, and the second rinse nozzle. According to this configuration, it is possible to suppress the rinse liquid from being scattered around the reversing machine.

The cleaning tank may be provided with an opening at a position corresponding to an arm pair, positioned at a lower side, of the first arm pair and the second arm pair so as to enable the carry-out/in of the substrate through the opening, and the reversing machine may further include a shutter provided at the opening. According to this configuration, it is possible to deliver the substrate to the arm pair provided within the cleaning tank and positioned at the lower side.

The arm members, which constitute the first arm pair and the second arm pair, may include at least three pieces configured to grip the substrate. According to this configuration, the substrate may be stably gripped.

The reversing machine may further include a notch aligner configured to correct a notch provided in the substrate to a predetermined position. According to this configuration, the substrate may be correctly placed at a predetermined position.

The opening/closing mechanism may include: a first elastic member and a second elastic member configured to bias the first arm pair in a direction to open the first arm pair, a first guide follower mounted on the first elastic member, a second guide follower mounted on the second elastic member, a third elastic member and a fourth elastic member configured to bias the second arm pair in a direction to open the second arm pair, a third guide follower mounted on the third elastic member, a fourth guide follower mounted on the fourth elastic member, a fixed holder configured to fix a guide follower positioned at a lower side among the first to fourth guide followers so that an arm pair, positioned at a lower side, of the first and second arm pairs is not opened, and a movable holder configured to move a guide follower positioned at an upper side among the first to fourth guide followers between a position where the arm pair, positioned at the upper side, of the first and second arm pairs is opened and a position where the arm pair, positioned at the upper side, of the first and second arm pairs is closed, so that the arm pair, positioned at the upper side, of the first and second arm pairs is opened/closed. According to this configuration, with a single actuator configured to move the movable holder, the arm pair, positioned at the lower side, of the first and second arm pairs, may be always in the closed state and the arm pair, positioned at the upper side, of the first and second arm pairs may be opened/closed. Thus, the opening/closing mechanism of the reversing machine may be miniaturized.

In a state where the first arm pair and the second arm pair are closed, a substantially circular opening may be formed by the fixed holder and the movable holder, and when the first to fourth guide followers rotate along the opening, the first arm pair and the second arm pair may be caused to rotate while the closed state is being maintained.

According to still another aspect of the present disclosure, there is provided a substrate polishing apparatus that includes: a polishing unit configured to polish a substrate; the above-described reversing machine; a cleaning unit configured to clean the substrate; and a transferring apparatus configured to access the polishing unit, the reversing machine, and the cleaning unit, and transfer the substrate between the polishing unit and the cleaning unit, or between each of the polishing unit and the cleaning unit and the reversing machine. By using a compact reversing machine, it is possible to suppress the substrate polishing apparatus from being enlarged.

The transferring apparatus may transfer the substrate from a cleaning unit where a first surface of the substrate is cleaned to the reversing machine, and after the substrate is reversed upside down by the reversing machine, the transferring apparatus may transfer the substrate from the reversing machine to a cleaning unit where a second surface of the substrate is cleaned. According to this configuration, both the top and bottom surfaces of the substrate may be cleaned.

The substrate polishing apparatus may be provided with a plurality of cleaning units, and the cleaning unit which cleans the second surface of the substrate may be different from the cleaning unit which cleans the first surface of the substrate. According to this configuration, the substrate processing throughput may be improved.

According to the present disclosure, when a substrate is received, the substrate is mounted on the arm pair positioned at the lower side, then, the arm pair positioned at the upper side is closed to grip the substrate, and the two sets of arm pairs are rotated so as to reverse the substrate upside down. Subsequently, the arm pair moved to the upper side from the lower side by the reversing operation may be opened so as to deliver the substrate to the next process. Thus, no temporary mounting table is needed, and thus, the reversing machine may be miniaturized. As a result, it is also possible to miniaturize the substrate processing apparatus.

Hereinafter, exemplary embodiments of the present disclosure will be described in detail with reference to the accompanying drawings.

FIG. 1 is a perspective view of a reversing machine 100 according to an exemplary embodiment. The reversing machine 100 includes a cleaning tank 1 provided with a removable ceiling cover 11 and a removable rear cover 12, and is provided therein with, for example, an arm pair (not illustrated) of a substrate reversing mechanism 2. In addition, the reversing machine 100 includes a ceiling cover detection sensor 11a configured to detect whether the ceiling cover 11 is mounted and a rear cover detection sensor 12a configured to detect whether the rear cover 12 is mounted.

Figure 2:
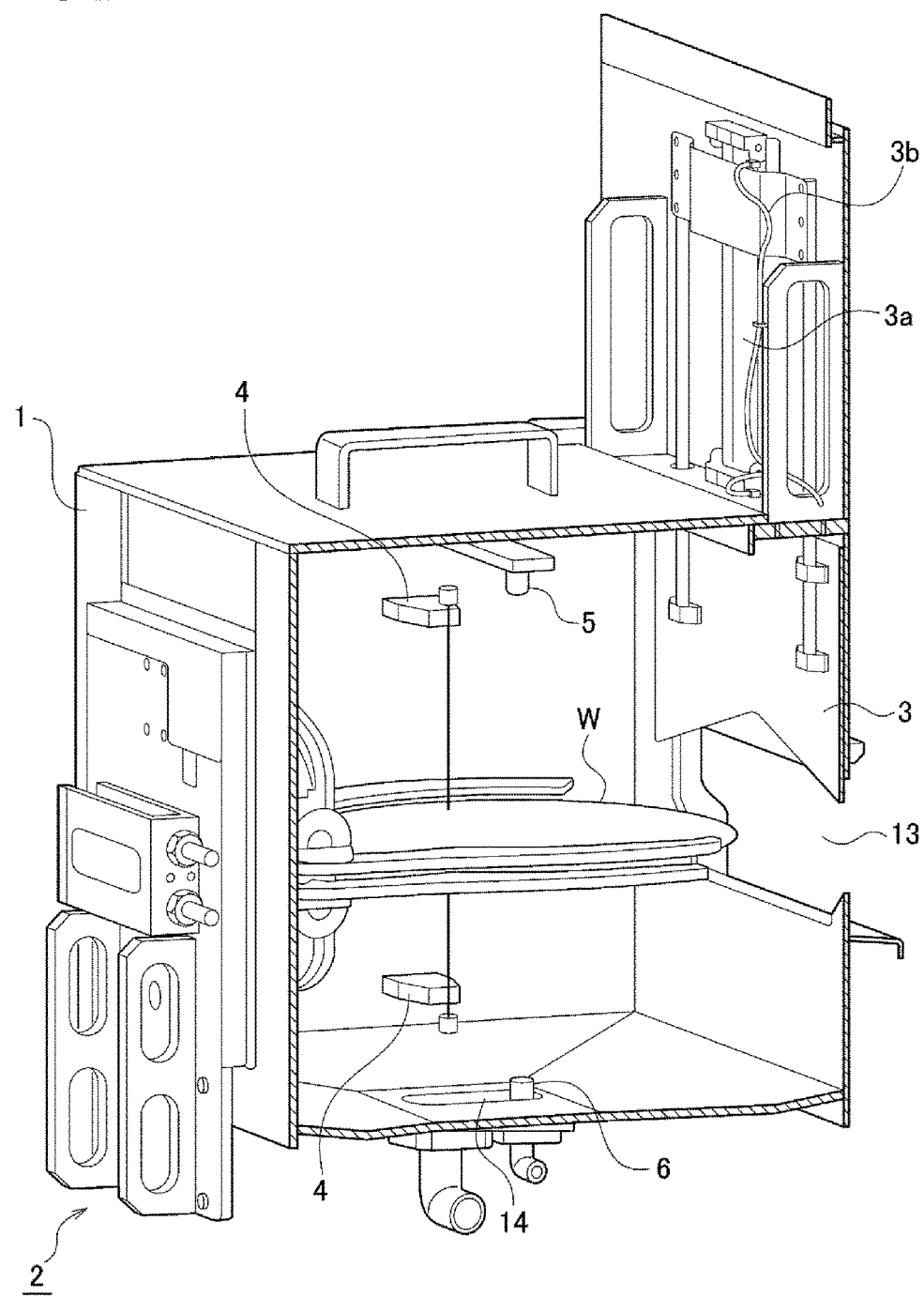
FIG. 2 is a perspective view illustrating the inside of the reversing machine.

FIG. 2 is a perspective view illustrating the inside of the reversing machine 100. The reversing machine 100 includes the substrate reversing mechanism 2, a shutter 3, a substrate detection sensor 4, and rinse nozzles 5, 6.

An opening 13 is formed on one side of the cleaning tank 1 in front of the substrate reversing mechanism 2, and the shutter 3 is installed to the opening 13. When the shutter 3 moves upward to open the opening 13, delivery or reception of a substrate W may be performed between the reversing machine 100 and a substrate transferring robot (not illustrated) through the opening 13. When the delivery or reception of the substrate W is completed, the shutter 3 moves downward to close the opening 13.

The shutter 3 is moved vertically by a shutter opening/closing air cylinder 3a. The switching of air supply/discharge of the shutter opening/closing air cylinder 3a is performed by a solenoid valve (not illustrated). In addition, a shutter opening/closing detection sensor 3b is provided to detect the opening/closing state of the shutter 3.

The substrate detection sensor 4 detects whether a substrate W is gripped by the substrate reversing mechanism 2. As a specific example, the substrate detection sensor 4 includes a light emission unit and a light reception unit which are disposed above and below the position where the substrate W is gripped, respectively. When the light reception unit is in a state where it cannot receive light from the light emission unit, it is detected that the substrate W is gripped by the substrate reversing mechanism 2.

The rinse nozzle 5 is provided above the position where the substrate W is gripped so as to supply rinse liquid such as, for example, deionized water (DIW) to the top surface (front surface) of the substrate W. The rinse nozzle 6 is provided below the position where the substrate W is gripped so as to supply rinse liquid such as, for example, DIW to the bottom surface (rear surface) of the substrate W. The supply/stop of the rinse liquid from the rinse nozzles 5, 6 is performed by an air operation valve (not illustrated).

By supplying the rinse liquid to the top and bottom surfaces of the substrate W, it is possible to prevent the substrate W from being dried when the substrate W is reversed. In addition, the substrate W or the rinse nozzles 5, 6 are accommodated within the cleaning tank 1 in order to suppress the rinse liquid from being scattered around the reversing machine 100. The used rinse liquid is discharged to the outside of the cleaning tank 1 through an opening 14 formed in the bottom side of the cleaning tank 1.

Subsequently, the structure to reverse a substrate W upside down in the substrate reversing mechanism 2 will be described in detail.

Figure 3:
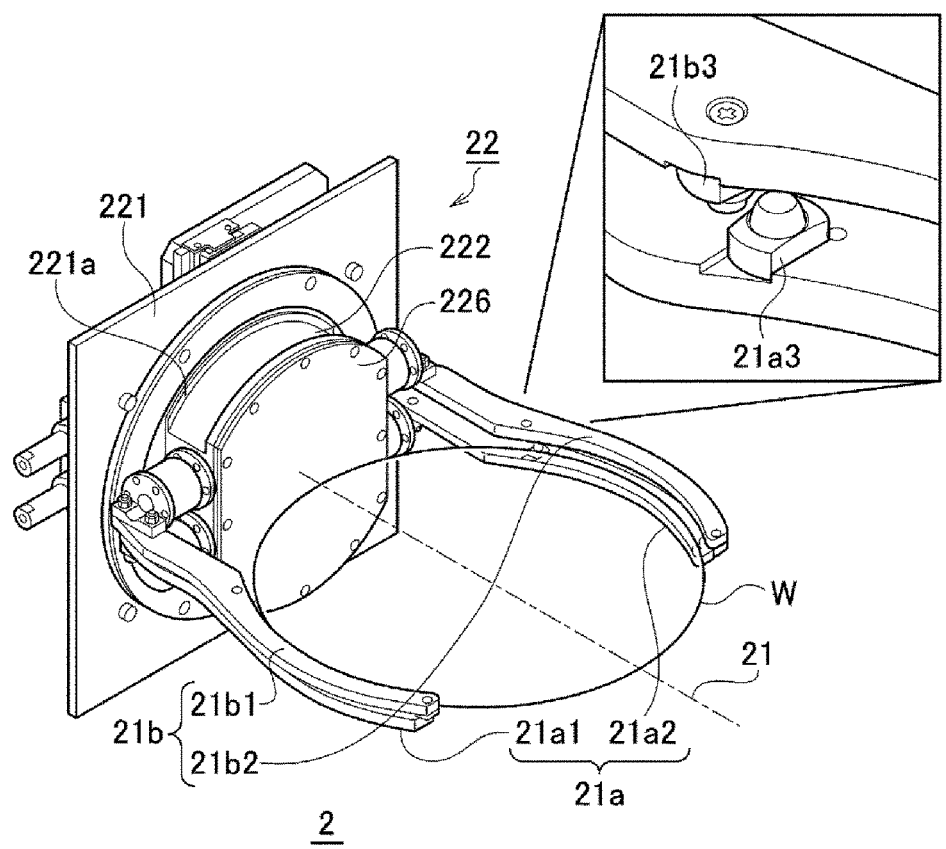
FIG. 3 is a front side perspective view illustrating a substrate reversing mechanism.

FIG. 3 is a front side perspective view illustrating the substrate reversing mechanism 2. The substrate reversing mechanism 2 includes two arm pairs 21a, 21b provided within the cleaning tank 1 and a rotating mechanism 22 configured to rotate the arm pairs 21a, 21b. The substrate reversing mechanism 2 may perform delivery and reception of a substrate W with a substrate transferring robot (not illustrated) on the arm pairs 21a, 21b without using a temporary mounting table. In addition, when the substrate transferring robot accesses the substrate reversing mechanism 2, the arm pair, positioned at the upper side, of the arm pairs 21a, 21b (the arm pair 21b in FIG. 3) is opened. Then, the upper arm pair is closed so that the substrate W is gripped, and both of the arm pairs 21a, 21b rotate around a single axis so as to reverse the substrate W upside down. This will be described below.

The arm pair 21a has a substantially symmetric shape with respect to an axis 21. More specifically, the arm pair 21a may be constituted with two arm members 21a1, 21a2 which are positioned at the same distance from the axis 21. Likewise, the arm pair 21b may be constituted with two arm members 21b1, 21b2. The axis 21 is a symmetric axis that is set inside the arm pairs 21a, 21b and extends along the extension direction of the arm pairs, and may be referred to as a line passing through the center of the gripped substrate W. The arm pairs 21a and 21b face with each other, and the substrate W is gripped therebetween.

FIG. 3 also illustrates a portion of the arm pairs 21a, 21b in an enlarged scale. As illustrated in the enlarged view, the lower arm pair 21a is provided with an upwardly protruding piece 21a3. In addition, the upper arm pair 21b is provided with a downwardly protruding piece 21b3 at a position displaced from the piece 21a3. When the distal ends of the pieces 21a3, 21b3 are in contact with the substrate W, the substrate W is stably gripped between the arm pairs 21a, 21b. In order to grip the substrate W reliably, a plurality of (e.g., three or more) pieces may be provided on each of the arm pairs 21a, 21b.

In addition, the bevel portion of the substrate W is provided with a cutout (notch) in order to facilitate the identification and alignment of the crystal direction of the substrate W. In addition, the substrate reversing mechanism 2 may include a notch aligner (not illustrated) configured to detect the notch, and correct the notch to a predetermined position between the arm pairs 21a, 21b.

The arm pairs 21a, 21b are mounted on the rotating mechanism 22 and extend toward the front side (toward the opening 13 side in FIG. 2). The rotating mechanism 22 includes a fixed plate 221 provided with a circular opening 221a and an arm holding member (existing inside a cover 222) a portion of which is fitted to the opening 221a. The arm pairs 21a, 21b are fixed to the arm holding member (directly or indirectly). The axis 21 passes through substantially the center of the opening 221a and substantially the center of the gripped substrate W.

Figure 4:
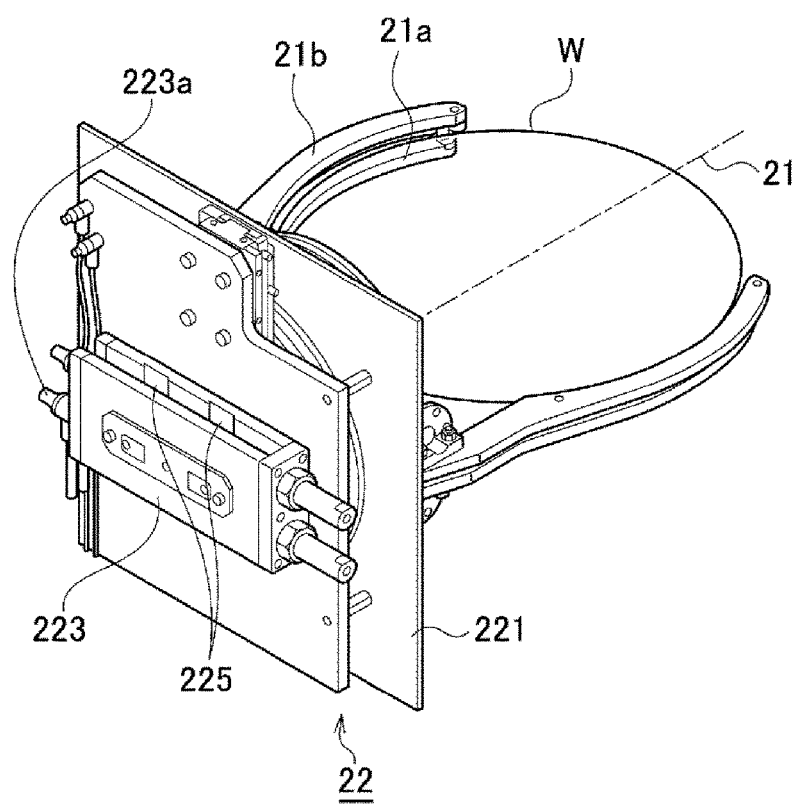
FIG. 4 is a rear side perspective view illustrating the substrate reversing mechanism.
Figure 5:
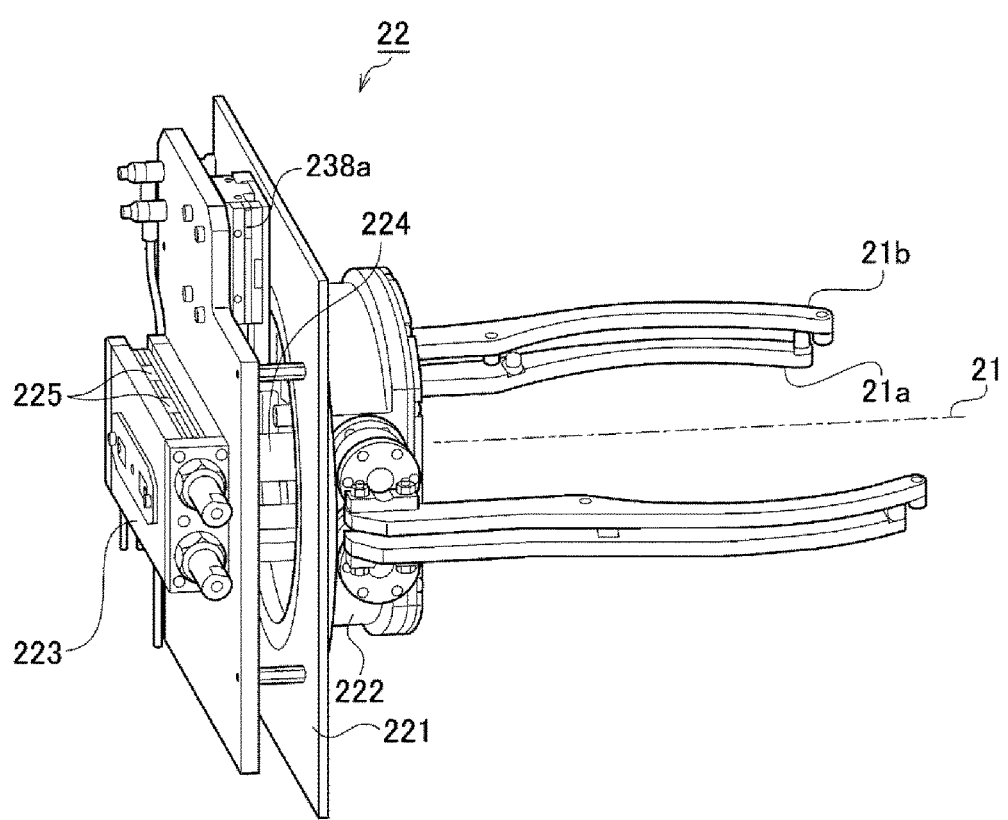
FIG. 5 is a side view illustrating the substrate reversing mechanism.

FIG. 4 is a rear side perspective view of the substrate reversing mechanism 2. In addition, FIG. 5 is a side view of the substrate reversing mechanism 2. The rotating mechanism 22 includes a pneumatically driven rotary actuator 223 (driving unit) provided on the rear side of the fixed plate 221 and a rotating shaft 224 (see, e.g., FIG. 5) passing through substantially the center of the opening 221a to interconnect the rotary actuator 223 and the arm holding member. In order to bring the rotating mechanism 22 into one of the two states to be described later, the air supply to the rotary actuator 223 is switched by a two-position double solenoid valve (not illustrated). The rotating speed of the rotary actuator 223 is adjusted by a speed controller 223a.

Here, it is assumed that the rotating mechanism 22 is brought into a first state or a second state. The first state refers to a state in which the arm pairs 21a, 21b extend substantially horizontally, and the arm pair 21b is positioned above the arm pair 21a. The second state refers to a state in which the arm pairs 21a, 21b extend substantially horizontally, and the arm pair 21a is positioned above the arm pair 21b. The state of the rotating mechanism 22 is detected by an arm pair state detection sensor 225 mounted on the rotary actuator 223.

In the rotating mechanism 22 which is in the first (second) state, when the rotary actuator 223 rotates the rotating shaft 224 by 180 degrees, the arm pairs 21a, 21b are rotated around the axis 21 so that the positional relationship of the arm pairs 21a, 21b is changed to the second (first) state and the substrate W is reversed upside down.

Here, the present disclosure will be further described in comparison to a reversing machine that includes a pair of arms, a temporary mounting table, and a lifting mechanism. In the case of the reversing machine that includes a pair of arms, a temporary mounting table, and a lifting mechanism, a series of operations are required as follows: a substrate is reversed upside down in a state of being gripped between the pair of arms; after the substrate is reversed upside down, the pair of arms are lifted by the lifting mechanism, and then, the substrate is placed on the temporary mounting table; and then a substrate transferring apparatus receives the substrate from the temporary mounting table, and delivers the substrate to the next process. Accordingly, it is presumed that, when the temporary mounting table or the lifting mechanism is merely removed from such a reversing machine, a trouble is caused in the series of substrate reversing and delivering operations.

In contrast, in an exemplary embodiment of the present disclosure, the arm pairs 21a, 21b are configured to be moved up and down and rotatable as described above. Thus, when a substrate is received, the substrate is mounted on the arm pair positioned at the lower side, and then, the arm pair positioned at the upper side is closed to grip the substrate. Then, the two sets of arm pairs are rotated so as to reverse the substrate upside down. Subsequently, the arm pair moved to the upper side from the lower side by the reversing operation may be opened so as to deliver the substrate to the next process.

Accordingly, the substrate W may be reversed upside down without needing a temporary mounting table, and furthermore, the positions of the substrate W before and after the substrate W is reversed upside down are coincident with each other. Thus, the reversing machine 100 may be miniaturized.

Next, a structure to grip a substrate W in the substrate reversing mechanism 2 will be described in detail. The substrate reversing mechanism 2 includes an opening/closing mechanism configured to open/close the arm pair, positioned at the upper side, of the arm pairs 21a, 21b. While there is no particular limitation in a specific aspect of the opening/closing mechanism, an opening/closing mechanism using an elastic member will be described below.

Figure 6:
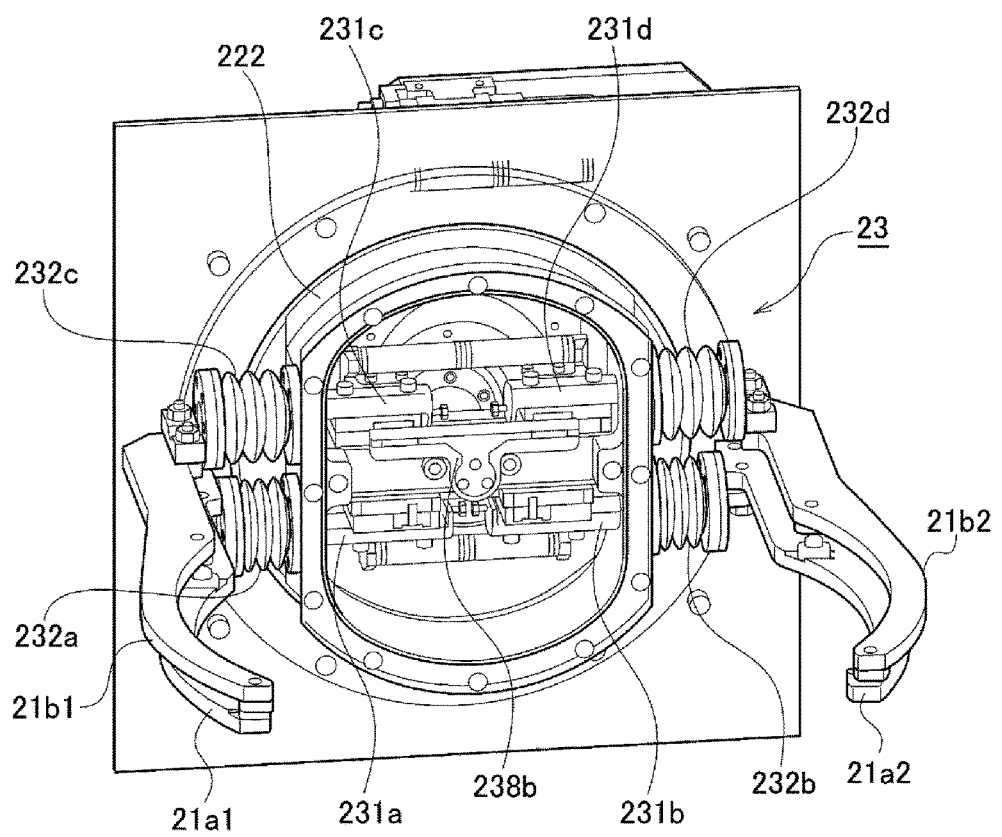
FIG. 6 is a front view illustrating the substrate reversing mechanism.

FIG. 6 is a front view of the substrate reversing mechanism 2. The substrate reversing mechanism 2 is illustrated in a state where a cover 226 in FIG. 3 is removed. The substrate reversing mechanism 2 includes an opening/closing mechanism 23 which includes four (4) arm mounting members 231a, 231b, 231c, 231d and four (4) bellows 232a, 232b, 232c, 232d.

The arm mounting members 231a, 231b, 231c, 231d penetrate the lateral sides of the cover 222 from the inside to the outside, and are mounted on the arm members 21a1, 21a2, 21b1, 21b2, respectively, using, for example, screws. In addition, the bellows 232a, 232b, 232c, 232d are installed between the lateral sides of the cover 222 and the arm members 21a1, 21a2, 21b1, 21b2, and the arm mounting members 231a, 231b, 231c, 231d are inserted into the bellows 232a, 232b, 232c, 232d, respectively.

Figure 7:
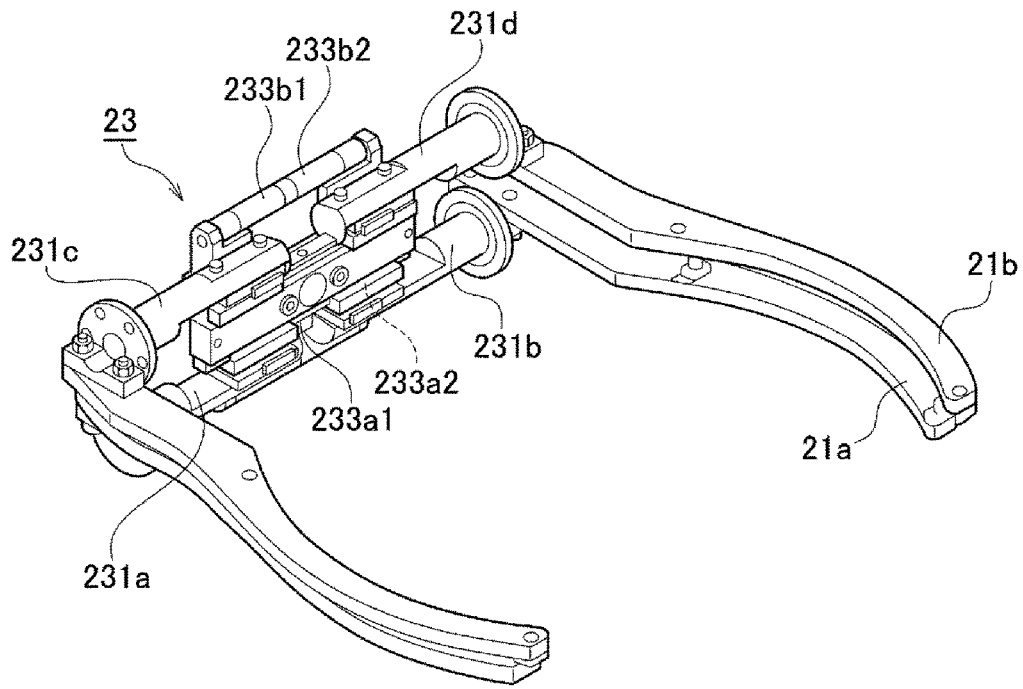
FIG. 7 is a front side perspective view illustrating an opening/closing mechanism.
Figure 8:
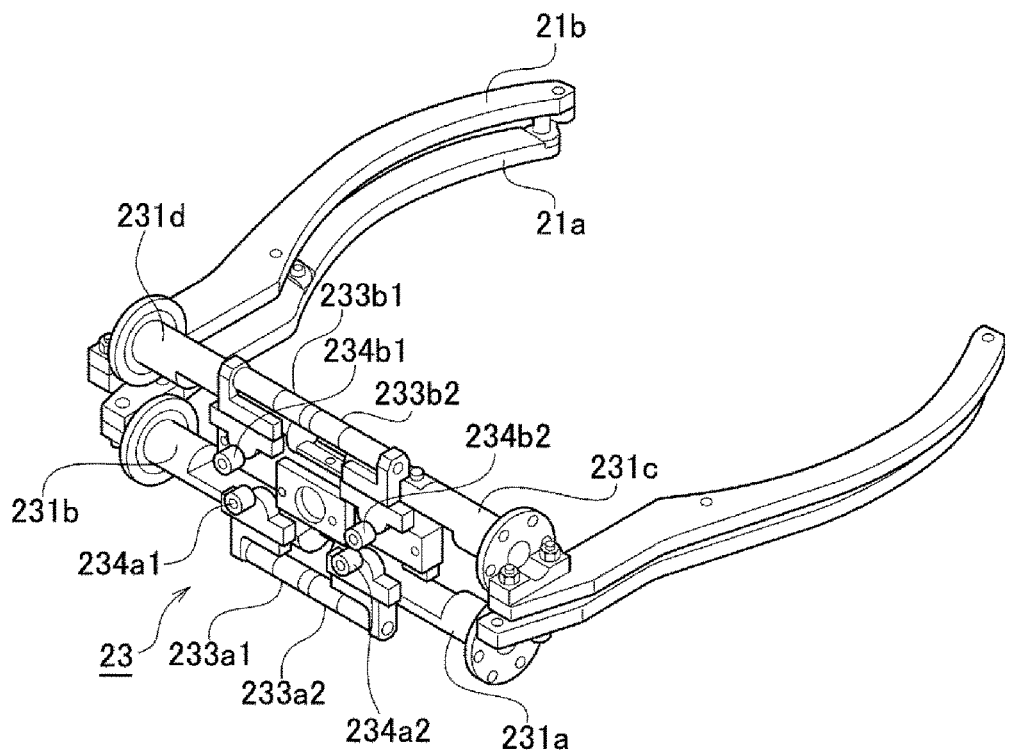
FIG. 8 is a rear side perspective view illustrating the opening/closing mechanism.

FIG. 7 is a front side perspective view of the opening/closing mechanism 23. In addition, FIG. 8 is a rear side perspective view of the opening/closing mechanism 23. The opening/closing mechanism 23 includes springs (elastic members) 233a1, 233a2 configured to bias the arm mounting members 231a, 231b outwardly, and springs (elastic members) 233b1, 233b2 configured to bias the arm mounting members 231c, 231d outwardly. The springs 233a1, 233a2 are located inside the arm pair 21a, and the springs 233b1, 233b2 are located inside the arm pair 21b. In a state where no lock is provided, the arm pairs 21a, 21b are brought into the opened state by the springs 233a1, 233a2, 233b1, 233b2.

As illustrated in FIG. 8, the opening/closing mechanism 23 includes two guide followers 234a1, 234a2 mounted on the springs 233a1, 233a2 (directly or indirectly), respectively, and two guide followers 234b1, 234b2 mounted on the springs 233b1, 233b2 (directly or indirectly), respectively. The guide followers 234a1, 234a2, 234b1, 234b2 protrude to the opposite sides to the arm pairs 21a, 21b.

Figure 9:
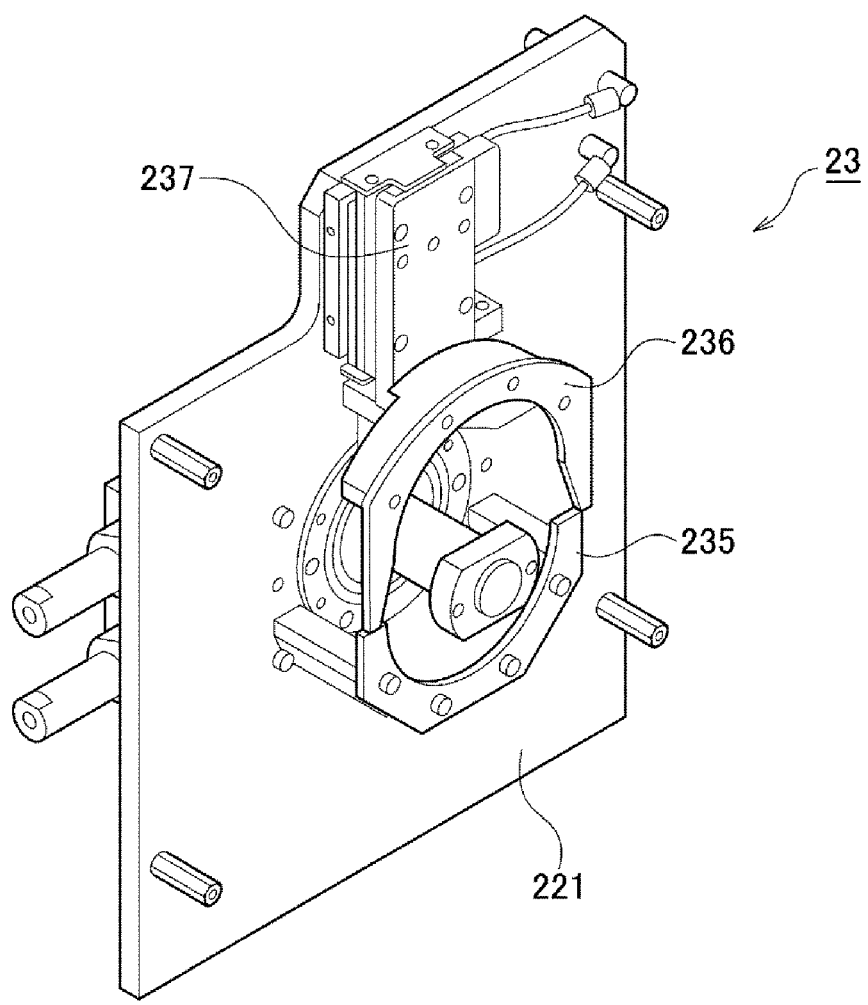
FIG. 9 is a rear side perspective view illustrating the opening/closing mechanism.

FIG. 9 is a front side perspective view of the opening/closing mechanism 23. The opening/closing mechanism 23 includes a fixed holder 235 fixed to the fixed plate 221, a movable holder 236 installed above the fixed holder 235, and a pneumatically driven guide slider 237 configured to move up and down the movable holder 236. In order to bring the arm pair positioned at the upper side into any one of the two states (opened state and closed state), the air supply to the guide slider 237 is switched by a two-position double solenoid valve (not illustrated). The moving speed of the guide slider 237 is adjusted by a speed controller (not illustrated).

Figure 10A:
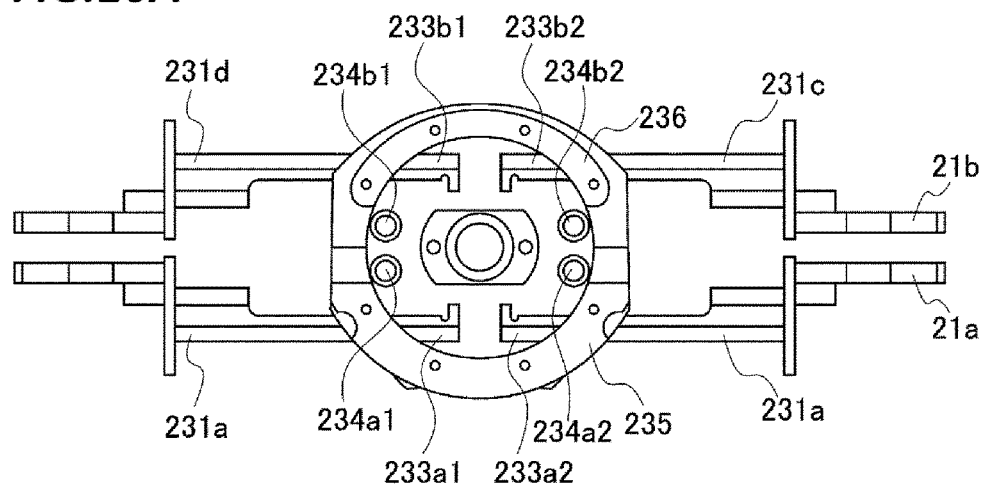
FIGS. 10A and 10B are views for schematically describing an operation of the opening/closing mechanism.
Figure 10B:
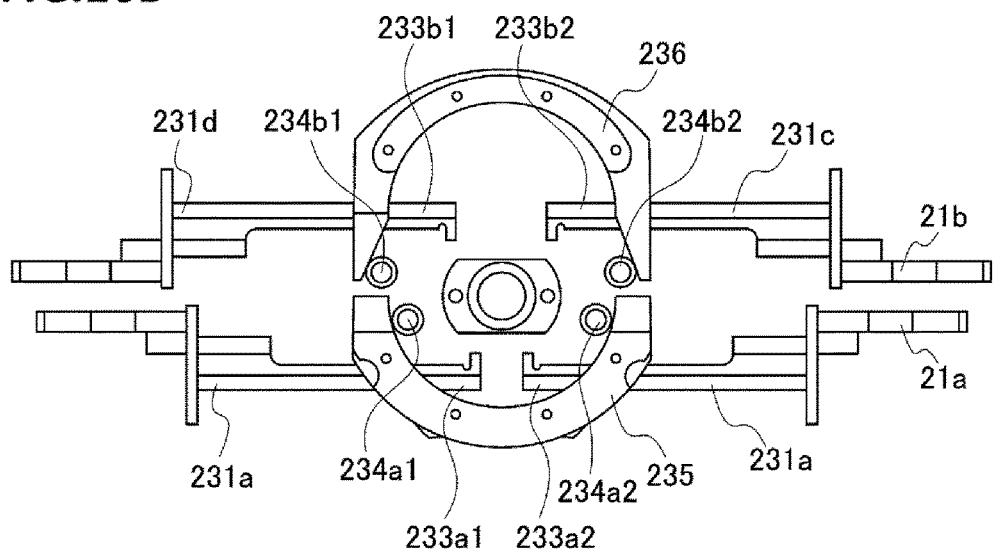

FIGS. 10A and 10B are views for schematically describing an operation of the opening/closing mechanism 23. As illustrated, the guide followers 234a1, 234a2 positioned at the lower side are fixed by the inner peripheral surface of the fixed holder 235. Thus, the springs 233a1, 233a2 may not be stretched outwardly, and the lower arm pair 21a is normally fixed in the fixed state.

Meanwhile, as illustrated in FIGS. 9 and 10B, the movable holder 236 has opposite distal ends that are formed in a taper shape and the inner diameter of the movable holder 236 is increased toward the distal ends. As illustrated in FIG. 10A, when the movable holder 236 is moved down by the guide slider 237, the guide followers 234b1, 234b2 are located at a portion where the inner diameter is short so that the upper arm pair 21b is brought into the closed state. At this time, a substantially circular opening is formed by the inner peripheral surfaces of the fixed holder 235 and the movable holder 236.

As illustrated in FIG. 10B, when the movable holder 236 is moved up by the guide slider 237, the guide followers 234b1, 234b2 are located at a portion where the inner diameter is large so that the upper arm pair 21b is moved outward by the force of the springs 233b1, 233b2 to be brought into the opened state.

As described above, regardless of which one of the arm pairs 21a, 21b is positioned at the upper side, the arm pair positioned at the lower side is always in the closed state, and the arm pair positioned at the upper side may take the closed state and the opened state. The opened/closed state of the arm pair positioned at the upper side is detected by arm pair opening/closing detection sensors 238a, 238b (see, e.g., FIGS. 5 and 6) that are mounted on the guide slider 237 and the arm mounting members 231a, 231b, respectively.

Figure 11:
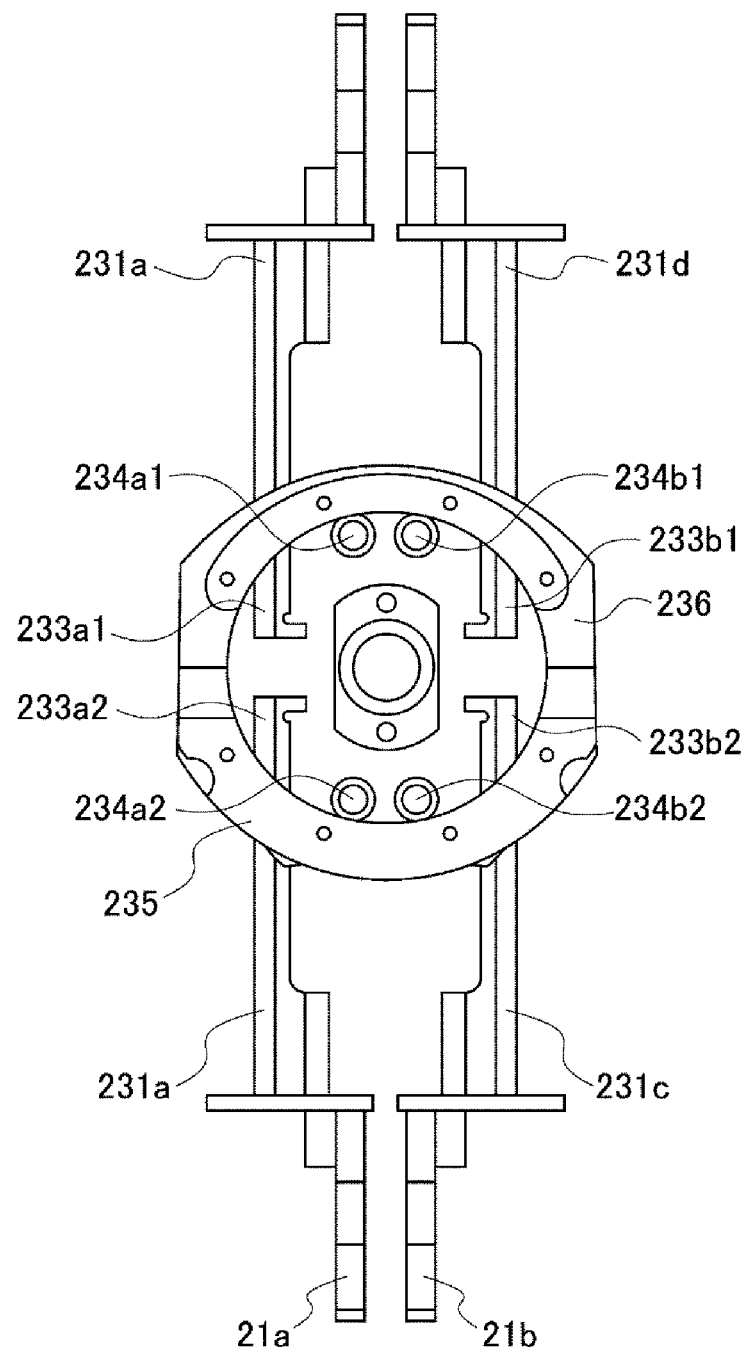
FIG. 11 is a view schematically illustrating a state in which the opening/closing mechanism is rotated by a rotating mechanism.

FIG. 11 is a view schematically illustrating a state in which the opening/closing mechanism 23 is rotated by the rotating mechanism 22. As illustrated, when the opening mechanism 23 is rotated, the movable holder 236 is moved down. Accordingly, the guide followers 234a1, 234a2, 234b1, 234b2 may be smoothly rotated along the circular opening formed by the inner peripheral surfaces of the fixed holder 235 and the movable holder 236. By this rotation, the upside-down relationship of the respective members other than the fixed holder 235 and the movable holder 236 is changed so that the roles of a member positioned at the upper side and members positioned at the lower side are also changed.

For example, when the arm pair 21a is positioned at the upper side by the rotation, the arm pair 21a is enabled to be opened/closed, and the arm pair 21b positioned at the lower side is not opened/closed.

Operations of the above-described reversing machine 100 will be described.

Figure 12:
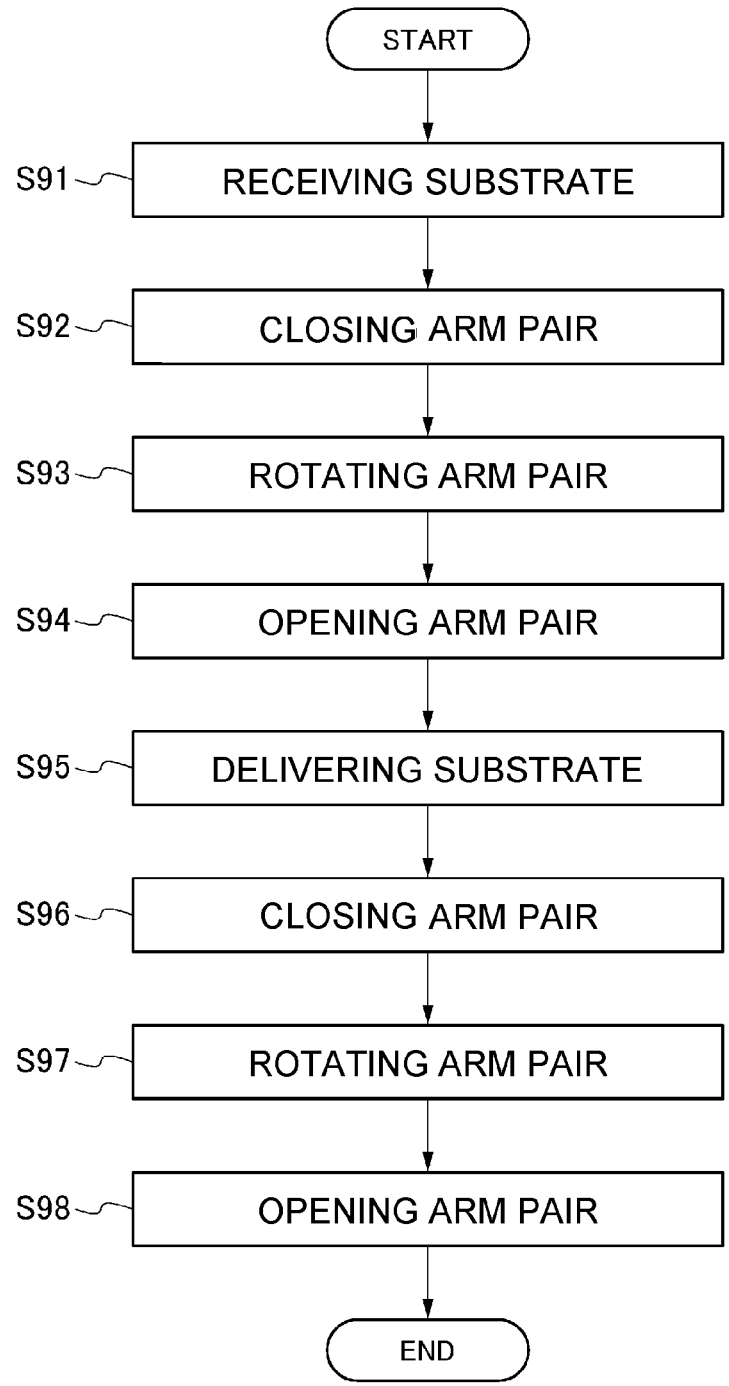
FIG. 12 is a flowchart illustrating a procedure when the reversing machine performs an automatic operation.

FIG. 12 is a flowchart illustrating a procedure when the reversing machine 100 performs an automatic operation. It is assumed that in the initial state, the arm pair positioned at the upper side is opened. First, a substrate W is received from a substrate transferring robot (step S91). Subsequently, the arm pair positioned at the upper side is closed (step S92). Then, the arm pairs 21a, 21b are rotated (step S93). As a result, the substrate W is reversed upside down.

Next, the arm pair positioned at the upper side is opened (step S94). Then, the substrate W is delivered to the substrate transferring robot (step S95). Then, the arm pair positioned at the upper side again is closed (step S96). In addition, the arm pairs 21a, 21b are rotated (step S97). Subsequently, the arm pair positioned at the upper side is opened (step S98).

Descriptions will be made on a substrate polishing apparatus that uses the above-described reversing machine 100.

Figure 13:
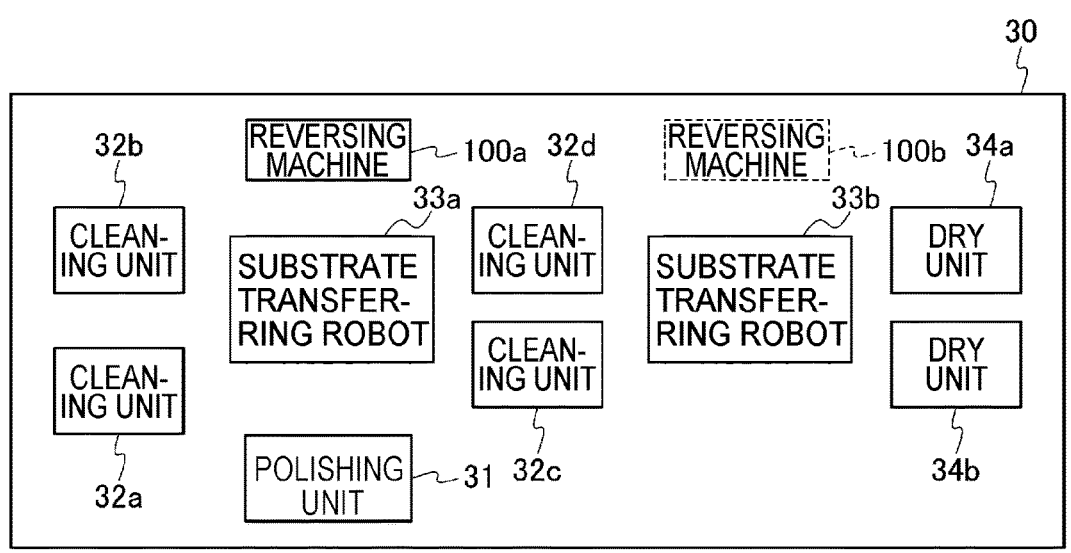
FIG. 13 is a view schematically illustrating a configuration of a substrate polishing apparatus.

FIG. 13 is a view schematically illustrating a configuration of a substrate polishing apparatus 30. The substrate polishing apparatus 30 includes a polishing unit 31, one or more cleaning units 32a, 32b, 32c, 32d, one or more reversing machines 100a, 100b, substrate transferring robots 33a, 33b, and one or more dry units 34a, 34b.

The substrate transferring robot 33a is disposed at a position where the substrate transferring robot 33a is capable of accessing any of the reversing machine 100a and the cleaning units 32a, 32b, 32c, 32d. At least one of the cleaning units 32a, 32b, 32c, 32d cleans the front surface of the substrate W, and at least one of the others cleans the rear surface of the substrate W. All the cleaning units 32a, 32b, 32c, 32d may be equal to each other, or may be different from each other. For example, some of the cleaning units may be a pencil type, and the remainders may be a sponge type.

In addition, the substrate transferring robot 33b is disposed at a position where the substrate transferring robot 33b is capable of accessing any of the cleaning units 32c, 32d and the dry units 34a, 34b. When the reversing machine 100b is installed, the substrate transferring robot 33b is also capable of accessing the reversing machine 100b.

Figure 14A:
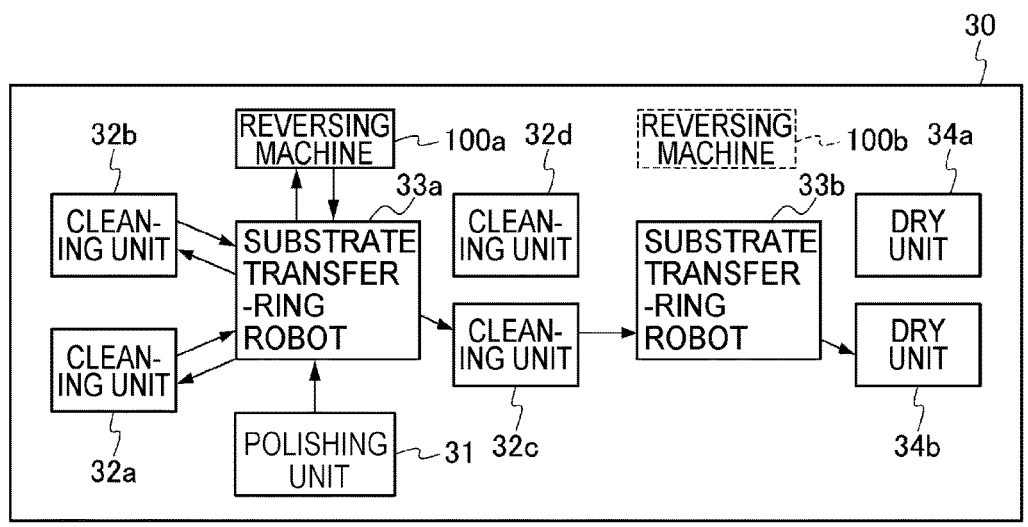
FIGS. 14A and 14B are views for describing a substrate moving route.
Figure 14B:
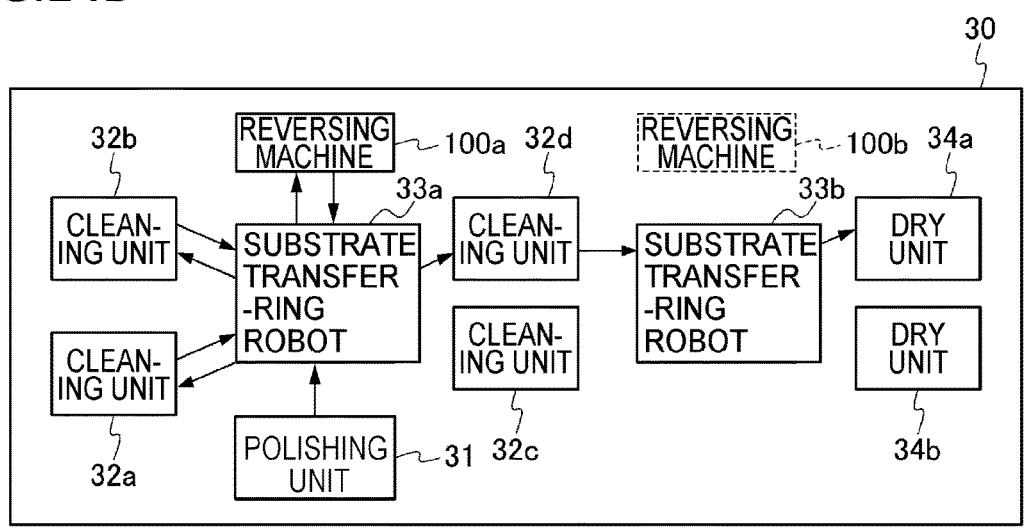

FIGS. 14A and 14B are views for describing the moving routes of a substrate W. FIG. 14A illustrates a moving route of a substrate W. First, the substrate W is subjected to polishing on its front surface by the polishing unit 31. Subsequently, the substrate transferring robot 33a receives the substrate W from the polishing unit 31, and delivers the substrate W to the cleaning unit 32a. The cleaning unit 32a cleans the front surface of the substrate W. Subsequently, the substrate transferring robot 33a receives the substrate W from the cleaning unit 32a, and delivers the substrate W to the cleaning unit 32b. The cleaning unit 32b cleans the front surface of the substrate W.

Thereafter, the substrate transferring robot 33a receives the substrate W from the cleaning unit 32b, and delivers the substrate W to the reversing machine 100a. The reversing machine 100a reverses the substrate W upside down. Then, the substrate transferring robot 33a receives the substrate W from the reversing machine 100a, and delivers the substrate W to the cleaning unit 32c. Since it is unnecessary to place the substrate W on a temporary mounting table when reversing the substrate W upside down, the reversing machine 100a may quickly perform the processes from reversing the substrate W upside down to delivering the substrate W to the cleaning unit 32c.

The cleaning unit 32c cleans the rear surface of the substrate W, i.e. the surface that is different from the surface cleaned by the cleaning units 32a, 32b. Subsequently, the substrate transferring robot 33b receives the substrate W from the cleaning unit 32c, and delivers the substrate W to the dry unit 34b. The dry unit 34b dries the substrate W.

FIG. 14B illustrates a moving route of another substrate W. After being reversed upside down by the reversing machine 100a, the substrate W is transferred to the cleaning unit 32d, and subsequently transferred to the dry unit 34a. In this way, different routes may be employed by substrates W.

When a plurality of cleaning units and dry units are provided and a moving route of a substrate W is properly selected depending on the cleaning processing situation in the cleaning units, the substrate processing throughput may be improved.

Figure 15:
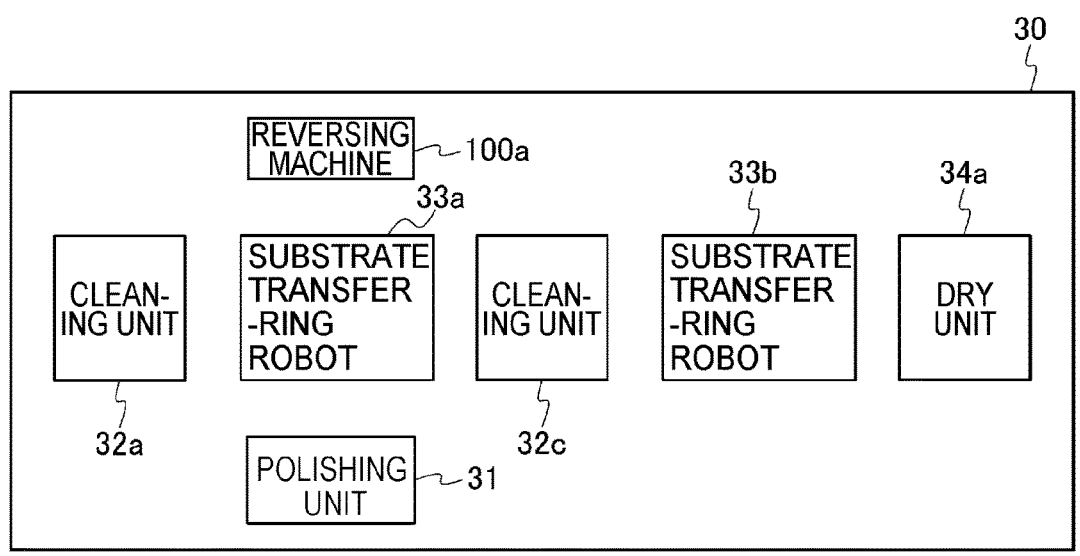
FIG. 15 is a view schematically illustrating a configuration of another substrate polishing apparatus.

FIG. 15 is a view schematically illustrating a configuration of another substrate polishing apparatus 30. The substrate polishing apparatus 30 includes two cleaning units 32a and 32c and one dry unit 34a. By arranging the cleaning units 32a, 32c in a row, it is possible to miniaturize the substrate polishing apparatus 30.

As described above, the reversing machine 100 according to the present exemplary embodiment is configured such that, when a substrate is received, the arm pair positioned at the upper side is opened while the arm pair positioned at the lower side remains in the closed state so that the substrate is mounted on the arm pair positioned at the lower side. Subsequently, the upper arm pair is closed to grip the substrate, and the arm pairs 21a, 21b are rotated with the substrate W being disposed therebetween, and subsequently, the arm pair moved from the lower side to the upper side by the reversing operation is opened so that a series of substrate delivery and reversing operations are enabled. Accordingly, a temporary mounting table becomes unnecessary so that the reversing machine 100 may be miniaturized and a substrate W may be quickly reversed upside down. In addition, when a substrate polishing apparatus 30 is provided with such a reversing machine 100, the foreign substances on the rear surface of the substrate W may also be efficiently removed without much enlarging the substrate polishing apparatus 30.

As described above, the reversing machine 100 according to the present exemplary embodiment is configured to perform a series of substrate delivery and reversing operations on the arm pairs 21a, 21b that grip a substrate W. Thus, the substrate W may be reversed upside down without using a temporary mounting table, and the reversing machine 100 may be miniaturized.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A reversing machine that reverses a substrate upside down, the reversing machine comprising:
    a first arm pair including a first arm and a second arm, the first arm pair configured to mount a substrate thereon;
    a second arm pair facing the first arm pair, the second arm pair including a third arm and a fourth arm, the third and fourth arms being configured to be freely opened and closed relative to each other;
    an opening/closing mechanism including a first elastic member and a second elastic member configured to bias the second arm pair in a direction to open the second arm pair, the opening/closing mechanism configured to open/close the third and fourth arms of the second arm pair relative to each other so as to grip the substrate mounted on the first arm pair; and
    a rotator configured to rotate the first arm pair and the second arm pair around a predetermined axis that is set inside the first arm pair and the second arm pair and extends along an extension direction of the first arm pair and the second arm pair such that the substrate is reversed upside down.

2. The reversing machine of claim 1, wherein the predetermined axis is a symmetric axis of the first arm pair and the second arm pair.

3. The reversing machine of claim 1, wherein a positional relationship between the first arm and the second arm of the first arm pair and the third arm and the fourth arm of the second arm pair is changed when the rotator rotates the first arm pair and the second arm pair.

4. The reversing machine of claim 1, further comprising:
    a first rinse nozzle configured to supply rinse water to a top surface of the substrate gripped by the second arm pair; and
    a second rinse nozzle configured to supply rinse ice to a bottom surface of the substrate gripped by the second arm pair.

5. The reversing machine of claim 4, further comprising:
    a cleaning tank configured to accommodate the first arm pair, the second arm pair, the first rinse nozzle, and the second rinse nozzle.

6. The reversing machine of claim 5, wherein the cleaning tank is provided with an opening at a position corresponding to an arm pair, positioned at a lower side, of the first arm pair and the second arm pair so as to enable carry-out/in of the substrate through the opening, and
    the reversing machine further comprises a shutter provided in the opening.

7. The reversing machine of claim 1, wherein the first, second, third and fourth arms, which constitute the first arm pair and the second arm pair, include at least three pieces configured to grip the substrate.

8. The reversing machine of claim 1, further comprising a notch aligner configured to correct a position of a notch provided in the substrate to a predetermined position.

9. A substrate polishing apparatus comprising:
    a polisher configured to polish a substrate;
    the reversing machine defined in claim 1;
    at least one cleaner configured to clean the substrate; and
    a transporter configured to access the polisher, the reversing machine, and the cleaner, and transfer the substrate between the polisher and the cleaner or between each of the polisher and the cleaner and the reversing machine.

10. The substrate polishing apparatus of claim 9, wherein the transporter is configured to transfer the substrate from one cleaner configured to clean a first surface to the reversing machine, and, after the substrate is reversed upside down by the reversing machine, transfer the substrate from the reversing machine to another cleaner configured to clean a second surface of the substrate.

11. The substrate polishing apparatus of claim 9, wherein the substrate polishing apparatus includes a plurality of cleaners, and
    the cleaner configured to clean the second surface of the substrate is different from the cleaner configured to clean the first surface of the substrate.

12. The reversing machine according to claim 1, wherein the opening/closing mechanism is opened/closed in a horizontal direction with respect to a substrate holding surface of the second arm pair.

13. A reversing machine that reverses a substrate upside down, the reversing machine comprising:
    a first arm pair including a first arm and a second arm, the first arm pair configured to mount a substrate thereon;
    a second arm pair facing the first arm pair, the second arm pair including a third arm and a fourth arm configured to be freely opened/closed so as to grip the substrate mounted on the first arm pair;
    an opening and closing mechanism including a driver for independently opening and closing both the first arm relative to the second arm of the first arm pair and the third arm relative to the fourth arm of the second arm pair; and
    a rotator configured to rotate the first arm pair and the second arm pair so as to reverse the substrate upside down such that a position of the substrate before the substrate is reversed upside down and a position of the substrate after the substrate is reversed upside down are substantially coincident with each other.

14. The reversing machine of claim 13, wherein the opening/closing mechanism includes:
- a first elastic member and a second elastic member configured to bias the first arm pair in a direction to open the first arm pair,
- a first guide follower mounted on the first elastic member,
- a second guide follower mounted on the second elastic member,
- a third elastic member and a fourth elastic member configured to bias the second arm pair in a direction to open the second arm pair,
- a third guide follower mounted on the third elastic member,
- a fourth guide follower mounted on the fourth elastic member,
- a fixed holder configured to fix a guide follower positioned at a lower side among the first to fourth guide followers so that an arm pair, positioned at a lower side, of the first and second arm pairs is not opened, and
- a movable holder driven by the driver and configured to move a guide follower positioned at an upper side among the first to fourth guide followers between a position where an arm pair, positioned at the upper side, of the first and second arm pairs is opened and a position where the arm pair, positioned at the upper side, of the first and second arm pairs is closed, so that the arm pair, positioned at the upper side, of the first and second arm pairs is opened/closed.

15. The reversing machine of claim 14, wherein, in a state where the first arm pair and the second arm pair are closed, a substantially circular opening is formed by the fixed holder and the movable holder, and when the first to fourth guide followers are rotated along the opening, the first arm pair and the second arm pair are rotated while maintaining the closed state.

* * * * *